(12) United States Patent
Sasaki et al.

(10) Patent No.: US 6,796,269 B2
(45) Date of Patent: Sep. 28, 2004

(54) APPARATUS AND METHOD FOR MONITORING PLASMA PROCESSING APPARATUS

(75) Inventors: Ichiro Sasaki, Ichikawa (JP); Toshio Masuda, Toride (JP); Muneo Furuse, Kudamatsu (JP); Hideyuki Yamamoto, Kudamatsu (JP)

(73) Assignee: Hitchi High-Technologies Corporation, Tokyo (JP)

( * ) Notice: Subject to any disclaimer, the term of this patent is extended or adjusted under 35 U.S.C. 154(b) by 210 days.

(21) Appl. No.: 10/229,027

(22) Filed: Aug. 28, 2002

(65) Prior Publication Data

US 2003/0102083 A1 Jun. 5, 2003

(30) Foreign Application Priority Data

Dec. 5, 2001 (JP) ........................................ 2001-371639

(51) Int. Cl.⁷ ............................................ C23C 16/509
(52) U.S. Cl. ................... 118/723 E; 118/712; 118/713; 156/345.28; 315/111.21
(58) Field of Search ............................... 118/723 E, 712, 118/713; 156/345.24, 345.25, 345.28, 345.47; 315/111.21; 427/569

(56) References Cited

U.S. PATENT DOCUMENTS 5,939,886 A * 8/1999 Turner et al. ................ 324/464
6,311,638 B1 * 11/2001 Ishii et al. ............ 118/723 MW
2001/0014520 A1 * 8/2001 Usui et al. .................... 438/586

FOREIGN PATENT DOCUMENTS

| JP | 8-330095 | 12/1996 |
| JP | 09-092491 | * 4/1997 |
| JP | 10-74734 | 3/1998 |
| JP | 2000-77390 | 3/2000 |
| JP | 2001-313285 | 11/2001 |

* cited by examiner

Primary Examiner—Laura Edwards
(74) Attorney, Agent, or Firm—Antonelli, Terry, Stout & Kraus, LLP

(57) ABSTRACT

The present apparatus comprises a vacuum process chamber 100 that contains an upper electrode 110 having a conductive plate 115 with gas supply holes for supplying a process gas and a lower electrode 130 having a platform on which a sample is to be mounted; process gas supply means 117 for supplying the process gas to the gas supply holes in the upper electrode 110 and exhaust means 106 for exhausting the vacuum process chamber; a high frequency power supply 121 for applying a high frequency power to the upper electrode to generate a plasma between the upper and lower electrodes; a high frequency bias power supply 122 for applying a high frequency power to the upper electrode to generate a direct current bias potential in the upper electrode; and abnormal discharge determination means 152 for determining whether an abnormal discharge has occurred or not based on the direct current bias potential generated in the upper electrode.

5 Claims, 6 Drawing Sheets

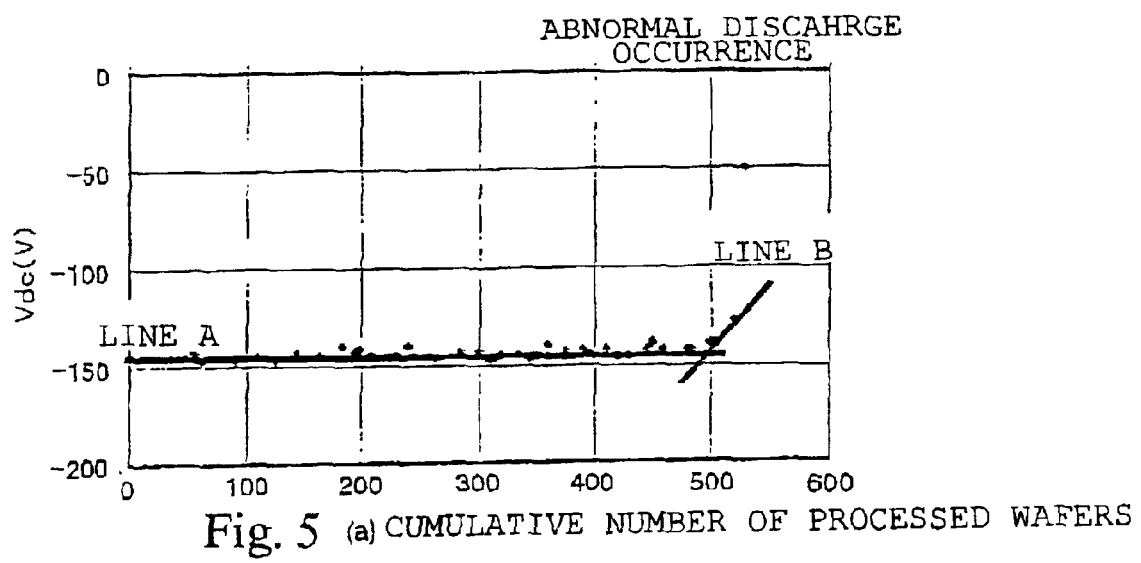
Fig. 5 (a) CUMULATIVE NUMBER OF PROCESSED WAFERS
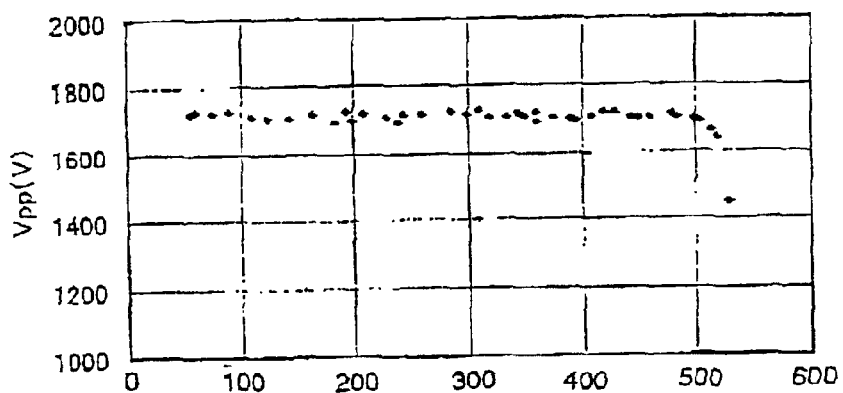
Fig. 5 (b) CUMULATIVE NUMBER OF PROCESSED WAFERS

APPARATUS AND METHOD FOR MONITORING PLASMA PROCESSING APPARATUS

BACKGROUND OF THE INVENTION

1. Field of the Invention

The present invention relates to the apparatus and method for monitoring a plasma processing apparatus. In particular, it relates to the apparatus and method for monitoring a plasma processing apparatus that reduces the processing failure caused by an abnormal discharge.

2. Description of the Related Art

In semiconductor manufacturing processes, plasma processing apparatus are widely used for micromachining processes, such as etching, film deposition and ashing. In a process involving plasma processing, a process gas introduced into a vacuum chamber (reactor) is changed into a plasma by plasma generator means and the plasma is caused to react with a surface of a semiconductor wafer to implement micromachining, and a volatile reaction product is discharged, thereby accomplishing the predetermined process.

With such a plasma processing apparatus, if the apparatus is used for a long time, components which are in direct contact with the plasma, such as the inner wall of the reactor, the upper electrode or a ring disposed around the wafer, are worn by the action of ions from the plasma. As a result, the gap between components or holes provided in a component (holes for blowing out the process gas, for example) becomes larger than the original (design) size. Such a larger gap or holes may result in another plasma occurring in the defined space. This discharge is so-called an "abnormal discharge". In other words, if the plasma processing apparatus is used for a long time, the "abnormal discharge" occurs therein.

In the past, abnormal discharge has been prevented from occurring by determining empirically a cumulative processing time from the replacement of a component to the occurrence of abnormal discharge, and replacing components with reference to this determined time. Japanese Patent Laid-Open No. 9-92491 entitled "PLASMA PROCESSING APPARATUS AND PLASMA PROCESSING METHOD" discloses a technique of reducing the frequency of occurrence of the abnormal discharge by detecting an occurrence of the abnormal discharge in a plasma processing container by a change in the reflected wave of a high frequency power applied to the plasma or change in the plasma light emission, thereby suppressing unexpected particle occurrence caused by the abnormal discharge.

If the abnormal discharge occurs, a dissociation state of the process gas changes to deteriorate the etching capability thereof, or a reaction product film formed in the reactor is peeled off creating a foreign matter. Therefore, if components are worn and deteriorated causing abnormal discharge to occur, a normal etching can no longer be accomplished.

In the past, as described above, the cumulative processing time elapsed from the replacement of a component to the abnormal discharge occurrence was determined empirically, and whether or not to replace a component was determined with reference to the time. However, abnormal discharge sometimes occurs before the elapse of reference time for component replacement. In such a case, the occurrence of the abnormal discharge would be recognized when a failed wafer is found during inspection. Thus, by that time, a considerable amount of poorly processed wafers would have resulted.

Besides, according to the method described in the Japanese Patent Laid-Open No. 9-92491 described above, while the abnormal discharge occurring in the plasma can be detected, any abnormal discharge occurring with the inner portion of the gas hole of the upper electrode as described above cannot be detected.

Detecting the abnormal discharge substantially simultaneously with the occurrence thereof provides the following advantages. That is, consumable components, which have been replaced with reference to the cumulative processing time obtained empirically in the past, can be used until abnormal discharge actually occurs. Thus, the components can be used longer and the cost of the consumable components can be reduced. Furthermore, if the cumulative processing time until the occurrence of the abnormal discharge can be predicted, the replacement component can be prepared in advance, so that the replacement can be accomplished efficiently. In addition, since the etching can be stopped immediately after the occurrence of the abnormal discharge to take appropriate measures, the number of failed wafers can be reduced to one.

This invention has been devised in view of the points described above and provides an apparatus for monitoring a plasma processing apparatus that can predict the occurrence of an abnormal discharge and detect the occurrence thereof immediately.

SUMMARY OF THE INVENTION

In order to solve the problems described above, the present invention comprises the following means.

The present invention comprises a vacuum process chamber that contains an upper electrode having a conductive plate with gas supply holes for supplying a process gas and a lower electrode having a platform on which a sample is to be mounted; process gas supply means for supplying the process gas to the gas supply holes in the upper electrode and exhaust means for exhausting the vacuum process chamber; a high frequency power supply for applying a high frequency power to the upper electrode to generate a plasma between the upper and lower electrodes; a high frequency bias power supply for applying a high frequency power to the upper electrode to generate a direct current bias potential in the upper electrode; and abnormal discharge determination means for determining whether an abnormal discharge occurs or not based on the direct current bias potential generated in the upper electrode.

BRIEF DESCRIPTION OF THE DRAWINGS

FIGS. 5a and 5b show relationships between the number of processed wafers and the bias potentials;

DETAILED DESCRIPTION OF THE PREFERRED EMBODIMENTS

Figure 1:
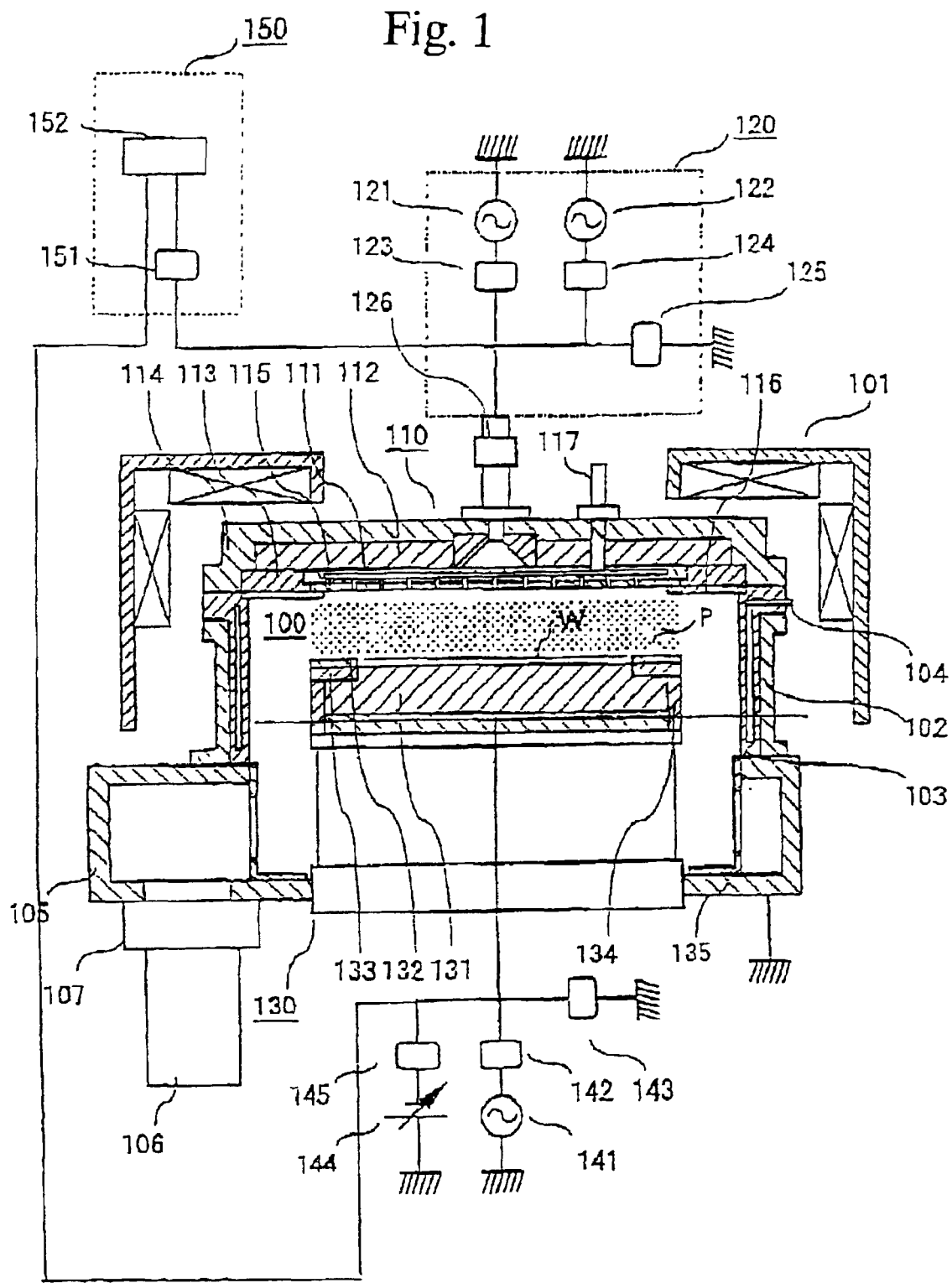
FIG. 1 shows an apparatus for monitoring a plasma processing apparatus according to the present invention.

Now, a preferred embodiment of this invention will be described with reference to the accompanying drawings. FIG. 1 shows an apparatus for monitoring a plasma processing apparatus according to the embodiment of this invention, in which the plasma processing apparatus is a magnetic field UHF band electromagnetic wave radiation discharge type plasma etching apparatus. In this drawing, the plasma etching apparatus is schematically shown in section.

In FIG. 1, a process chamber 100 of the plasma processing apparatus is a vacuum container capable of attaining a degree of vacuum on the order of $10^{-5}$ Torr. An antenna 110 (upper electrode) for radiating electromagnetic waves is provided at the upper part of the process chamber, and a lower electrode 130 on which a sample W, such as a wafer, is to be mounted is provided at the lower part thereof. The antenna 110 and the lower electrode 130 are disposed in parallel facing each other. Magnetic field generator means 101, which is composed of an electromagnetic coil and a yoke, for example, is disposed around the process chamber 100. The electromagnetic wave radiated from the antenna 110 and the magnetic field generated by the magnetic field generator means 101 interact with each other to change the process gas introduced to the process chamber into a plasma P, with which the sample W is processed.

The process chamber 100 is evacuated by an evacuation system 106 connected to a vacuum chamber 105 and the pressure thereof is controlled by pressure control means 107. The process pressure is controlled to fall within the range from 0.1 Pa to 10 Pa, and desirably from 0.5 Pa to 4 Pa. The process chamber 100 and the vacuum chamber 105 are at a ground potential. It is desired that the side wall 102 of the process chamber 100 contains no heavy metal and is made of a non-magnetic metal material with high thermal conductivity, such as aluminum, and is surface-treated, such as anodized, to resist against plasma.

The antenna 110 is composed of a disk conductor 111 made of Si, C or SiC, a dielectric 112 and a dielectric ring 113, and is held in a housing 114 which constitutes a part of the vacuum container. A conductive plate 115 is disposed on a surface of the disk conductor 111 which is in contact with the plasma, and a peripheral ring 116 is disposed surrounding the conductor plate. Temperature control means (not shown), in other words, means for circulating a heating medium in the disk conductor 111 maintains the temperature of the disk conductor 111 at a predetermined value, and thus, the surface temperature of the conductive plate 115 in contact with the disk conductor 111 is controlled. The process gas for performing certain processing to the sample, such as etching and film deposition, is supplied from gas supply means 117 with predetermined flow rate and mixture ratio, controlled to have a predetermined distribution via a large number of holes provided in the disk conductor 111 and the conductive plate 115, and supplied to the process chamber 100.

An antenna power supply 121 and an antenna bias power supply 122, which constitute an antenna power supply unit 120, are connected to the antenna 110 via matching circuit and filter systems 123 and 124, respectively. The antenna 110 is grounded via a filter 125. The antenna power supply 121 supplies to the antenna disk conductor 111 a power on an UHF frequency band from 300 MHz to 1 GHz. If the diameter of the disk conductor 111 is set at a certain characteristic length, a natural excitation mode, such as TM01 mode, is provided. In this embodiment, the frequency of the antenna power supply 121 is 450 MHz and the diameter of the disk conductor 111 is 330 mm.

The antenna bias power supply 122 applies to the antenna 110 a bias power on a frequency from several tens of kHz to several tens of MHz. This enables to control the reaction on the surface of the conductive plate 115 in contact with the disk conductor 111. In particular, if the conductive plate 115 is made of silicon with high purity and oxide film etching is conducted using a gas based on CF, the reaction of P radical or CFx radical on the surface of the conductive plate 115 can be controlled to adjust the ratio of radicals. In the present embodiment, the frequency of the antenna bias power supply 122 is 13.56 MHz and the power thereof is 50 W to 600 W. Then, a bias potential Vdc is produced in the conductive plate 115 by self bias. In this embodiment, unlike a so-called parallel-plate capacitive-coupling plasma apparatus, the self bias occurring in the conductive plate 115 can be controlled independently of the plasma generation.

Here, the bias potential Vdc of the upper electrode produced in the conductive plate 115 and a voltage amplitude Vpp of the lower electrode can be monitored by an abnormal discharge monitoring apparatus 150 described later.

The distance between the lower surface of the conductive plate 115 and the wafer W is equal to or more than 30 mm and equal to or less than 150 mm, and desirably, equal to or more than 50 mm and equal to or less than 12 mm. Since the conductive plate 115 faces the sample W over a wide area, it has the greatest influence on the processing of the sample W.

The lower electrode 130 is disposed at a lower part of the process chamber 100 to face the antenna 110. A bias power supply 141 for supplying a bias power on a frequency from 400 kHz to 13.56 MHz, for example, is connected to the lower electrode 130 via a matching circuit and filter system 142 and controls the bias applied to the sample W. The lower electrode 130 is grounded via a filter 143. In this embodiment, the frequency of the bias power supply 141 is 800 kHz.

Now, a process of etching a silicon oxide film using the plasma etching apparatus, for example, will be described specifically with reference to FIG. 1.

First, the wafer W to be processed is introduced into the process chamber 100 via a sample introduction mechanism (not shown) and mounted on the lower electrode 130, which is fixed to position by supplying a DC voltage to an electrostatic suction apparatus 131 from a power supply for suction 144 via a filter 145. As required, at this time, the height of the lower electrode is adjusted to set the gap distance at a predetermined value. Then, the gas supply means 117 supplies the process gas required to etch the sample W, such as $C_4F_8$, Ar and $O_2$, to the process chamber 100 through the conductive plate 115 with a predetermined flow rate and mixture ratio.

At this time, the process chamber 100 is controlled to have a predetermined process pressure by the vacuum evacuation system 106 and the pressure control means 107. Then, the antenna 110 radiates electromagnetic waves in response to the power on a frequency of 450 MHz supplied thereto by the antenna power supply 121. The electromagnetic waves and the substantially horizontal magnetic field of 160 gauss (which is an electron cyclotron resonance magnetic field intensity provided by the frequency 450 MHz) generated in the process chamber 100 by the magnetic field generator means 101 interact with each other to produce the plasma P in the process chamber 100. Thus, the process gas is dissociated to produce ion radicals. The composition of the plasma containing ions and radicals and energies thereof are controlled via the antenna bias power from the antenna bias power supply 122 or the bias power from the bias power supply 141 for the lower electrode to etch the wafer W. Once the etching is completed, the supply of the high frequency power, magnetic field and process gas is stopped to complete the process.

As described above, a large number of gas holes (diameter: 0.4 to 0.5 mm) for introducing the process gas into the reactor are provided in the conductive plate 115 made of silicon and disposed to face the sample. The diameter of the gas hole becomes larger with time by the action of the ions from the plasma. As the hole becomes wider, the ions and electrons from the plasma tend to enter deeper into the hole, and eventually, the abnormal discharge occurs on the back side of the conductive plate 115.

If the abnormal discharge occurs on the back side of the conductive plate 115, a large amount of electrons and ions are produced there and introduced into the conductive plate (antenna electrode). Therefore, compared to the normal state, the amount of ions and electrons flowing into the entire antenna electrode is increased. This is equivalent to the area of the electrode being increased effectively. Since the area for grounding is not changed, the absolute value of the bias potential Vdc of the antenna electrode is decreased. In other words, when the abnormal discharge occurs on the back of the conductive plate, the bias potential Vdc is varied simultaneously.

The variation of the bias potential Vdc increases as the number of holes where the abnormal discharge occurs increases. This is because the amount of ions and electrons introduced is increased with the increase in the number of the holes. However, if the conductive plate 115 becomes worn over a long time use, the abnormal discharge does not necessarily occur within all of the gas holes (initially, the abnormal discharge occurs at only a small number of holes, and the number increases gradually). Thus, the variation of the bias potential Vdc is also small at first, and increases gradually. Therefore, the time of replacement of the conductive plate due to the abnormal discharge can be predicted by keeping track of the value of the bias potential Vdc.

Now, monitoring of the abnormal discharge using the apparatus for monitoring the plasma etching apparatus shown in FIG. 1 will be described.

Figure 3:
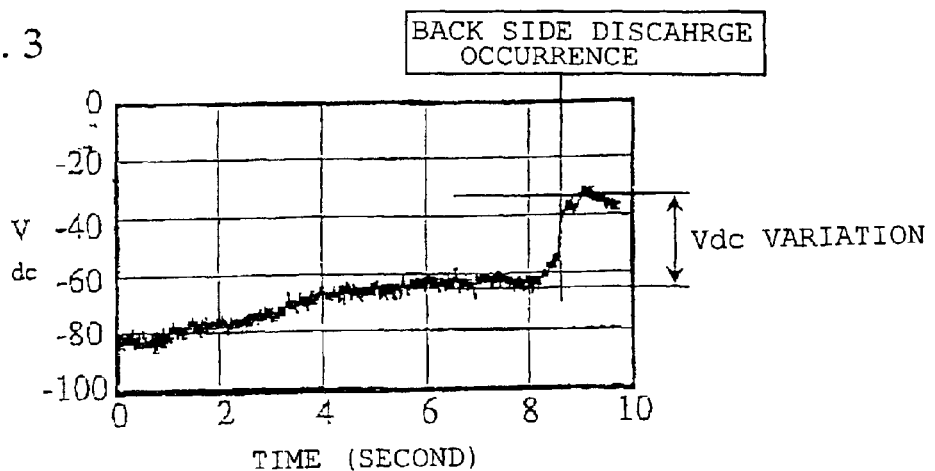
FIG. 3 shows a variation of a bias potential Vdc when an abnormal discharge occurs.

FIG. 3 shows the variation of the bias potential Vdc when an abnormal discharge occurs. FIG. 3 shows the result of an experiment conducted by visually checking whether the abnormal discharge has occurred or not. The description "back side discharge occurs" in this drawing implies that an abnormal discharge has occurred at this point in time. As shown, the bias potential Vdc changed rapidly from −60 V to −35 V at this point in time. The measurement values of the bias potential Vdc fluctuate slightly with time, and thus, the time-varying curve has a certain width. In the example shown in this drawing, the width is about 5 V. On the other hand, the variation of the bias potential Vdc when the abnormal discharge occurs is about 25 V. Therefore, the variation of the bias potential is large enough to be detected easily. In other words, the S/N ratio is sufficiently high.

Figure 4:
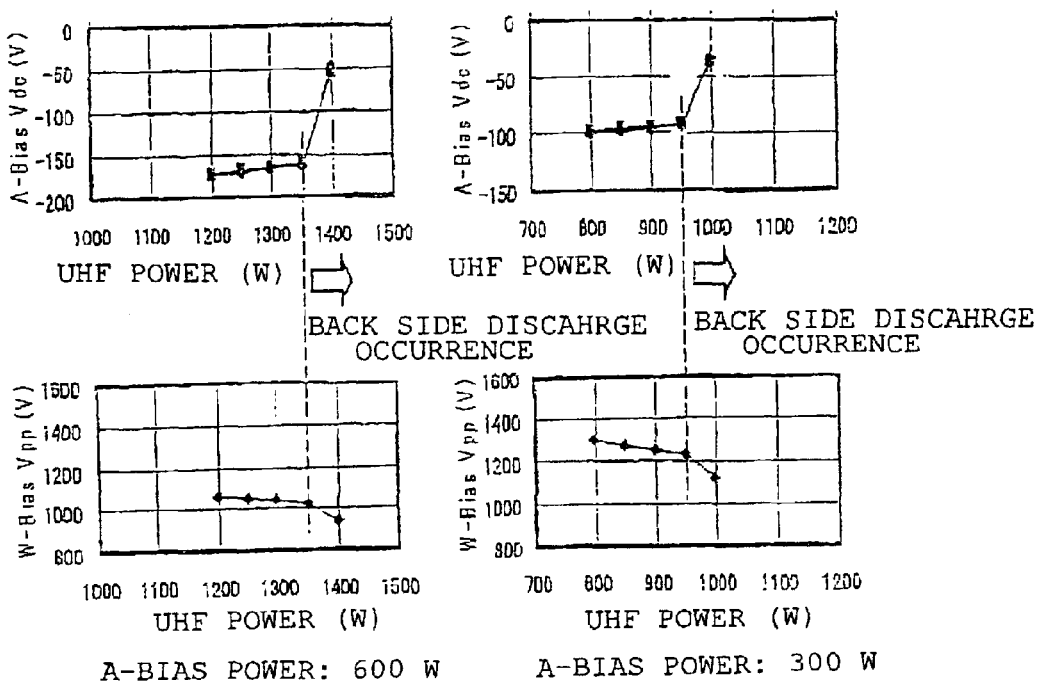
FIG. 4 shows variations of bias potentials applied to upper and lower electrodes.

FIG. 4 shows variations of the bias potential Vdc applied to the upper electrodes (A-Bias Vdc) and the voltage amplitude Vpp applied to the lower electrode (W-Bias Vpp) for bias powers of 600 W and 300 W. In this drawing, the horizontal axis indicates the power of the antenna power supply (UHF power). As can be seen from the drawing, the occurrence of the abnormal discharge can be detected by the variation of bias potential Vdc of the bias power supply (from −160 V to −50 V or −100 V to −30 V). In addition, the voltage amplitude Vpp of the lower electrode varies simultaneously with the occurrence of the abnormal discharge. In this experimental example, the voltage amplitude Vpp, which is on the order of 1000 V, varies by about 100 V due to the abnormal discharge. Thus, the S/N ratio is high enough to enable detection.

FIG. 5(*a*) is a plot of the relationship between the cumulative number of processed wafers and the bias potentials Vdc applied to the upper electrode. As shown in the drawing, points are plotted on a straight line A indicating that the measurement values are substantially constant until the elapse of a predetermined cumulative processing time and a straight line B indicating that the absolute value of the bias potential Vdc decreases with time.

That is, the occurrence of the abnormal discharge can be detected when the bias potential Vdc which has been substantially constant starts to vary. While the bias potential Vdc fluctuates slightly along the straight line A, the variation by the abnormal discharge is more significant as indicated by the line B. Thus, the abnormal discharge can be detected in terms of S/N ratio.

FIG. 5(*b*) is a plot of a relationship between the cumulative number of processed wafers and the voltage amplitude Vpp. Also in this case, the occurrence of the abnormal discharge can be detected by the bias potential Vpp which has been substantially constant starting to vary.

Figure 6:
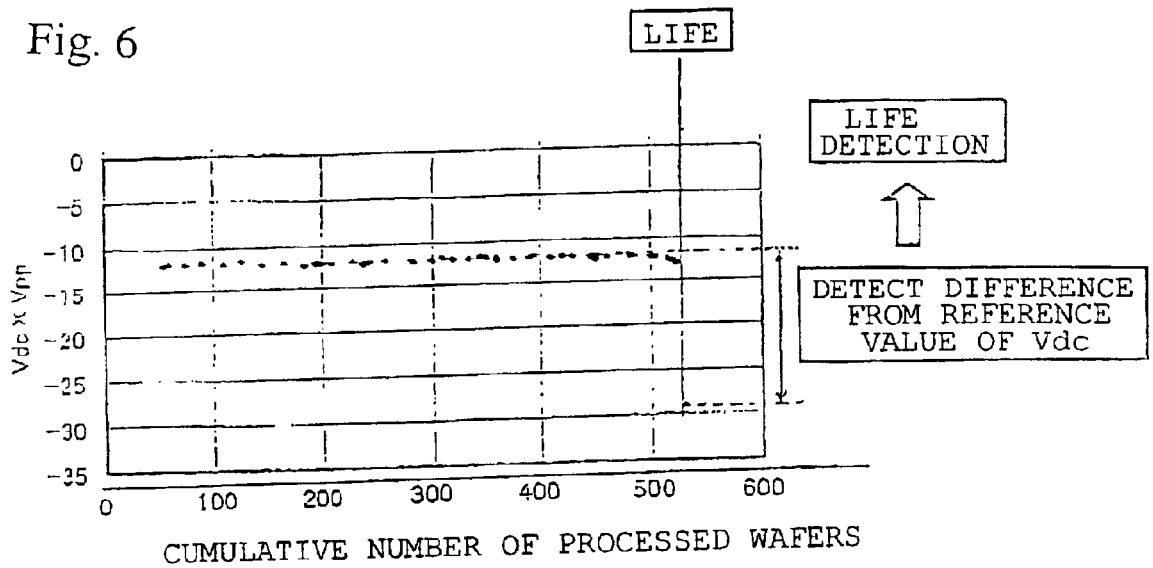
FIG. 6 shows a relationship between the product of the bias potentials applied to the upper and lower electrodes and the number of processed wafers.

FIG. 6 is a plot of the relationship between the product of the bias potential Vdc applied to the upper electrode and the voltage amplitude Vpp applied to the lower electrode and the cumulative number of processed wafers (cumulative processing time). Also in this case, the occurrence of the abnormal discharge can be detected by the product of the bias potentials Vdc and Vpp which has been substantially constant starting to vary. In this example, since the product of the bias potentials Vdc and Vpp is calculated, the detection sensitivity can be enhanced.

Figure 7:
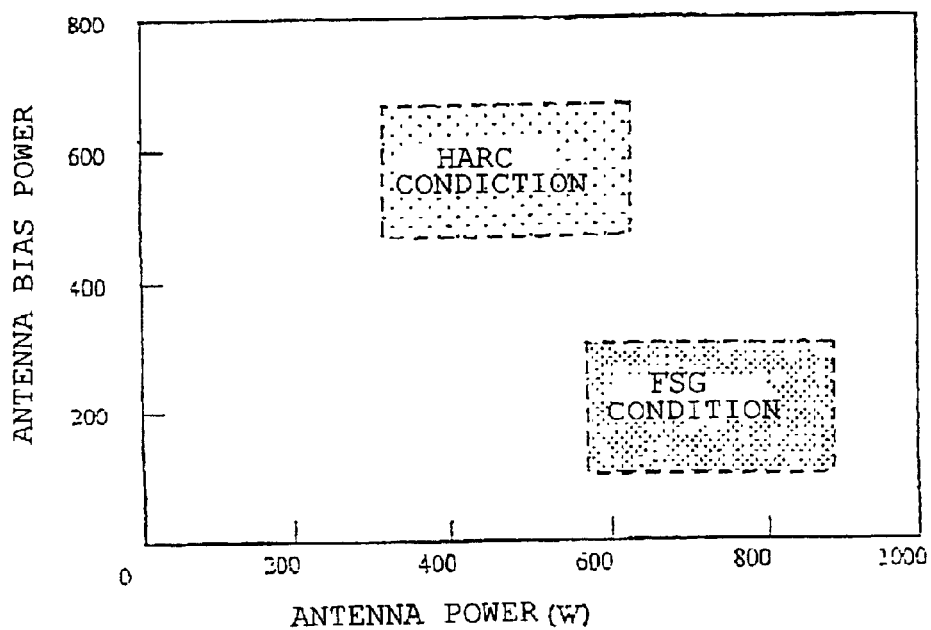
FIG. 7 is a diagram for illustrating normal ranges of the bias potentials.

FIG. 7 is a diagram illustrating the normal ranges (thresholds) of the bias potentials Vdc and Vpp. First, in order to determine whether the abnormal discharge occurs or not based on the variation of the bias potential Vdc, it is required to determine the normal value of the bias potential Vdc. The normal value of the bias potential Vdc varies according to etching conditions, and in particular, depends on the outputs of the two power supplies applied to the antenna, that is, the output of the antenna power supply 121 and the output of the antenna bias power supply 122. Thus, a normal value of the bias potential Vdc for a previously expected process condition (a condition for etching an FSG (fluorosilicate glass) (FSG condition) and a condition for forming an HARC (high aspect ratio contact) (HARC condition), for example) is determined in advance on a map as shown in FIG. 7 with the horizontal axis indicating the output of the antenna power supply 121 and the vertical axis indicating the output of the antenna bias power supply 122, and a database thereof is created.

The normal value or normal range of the bias potential Vdc can be determined by extracting the two outputs (outputs of the antenna power supply 121 and the antenna bias power supply 122) from a recipe. Abnormal discharge determination means 152 has such a database and a reference mechanism therefor.

As for the voltage amplitude Vpp, a similar database can be created. In this case, however, the horizontal axis indicates the output of the antenna power supply 121 and the vertical axis indicates the output of the bias power supply 141 for the lower electrode. The reference method is the same as in the above-described database.

Figure 2:
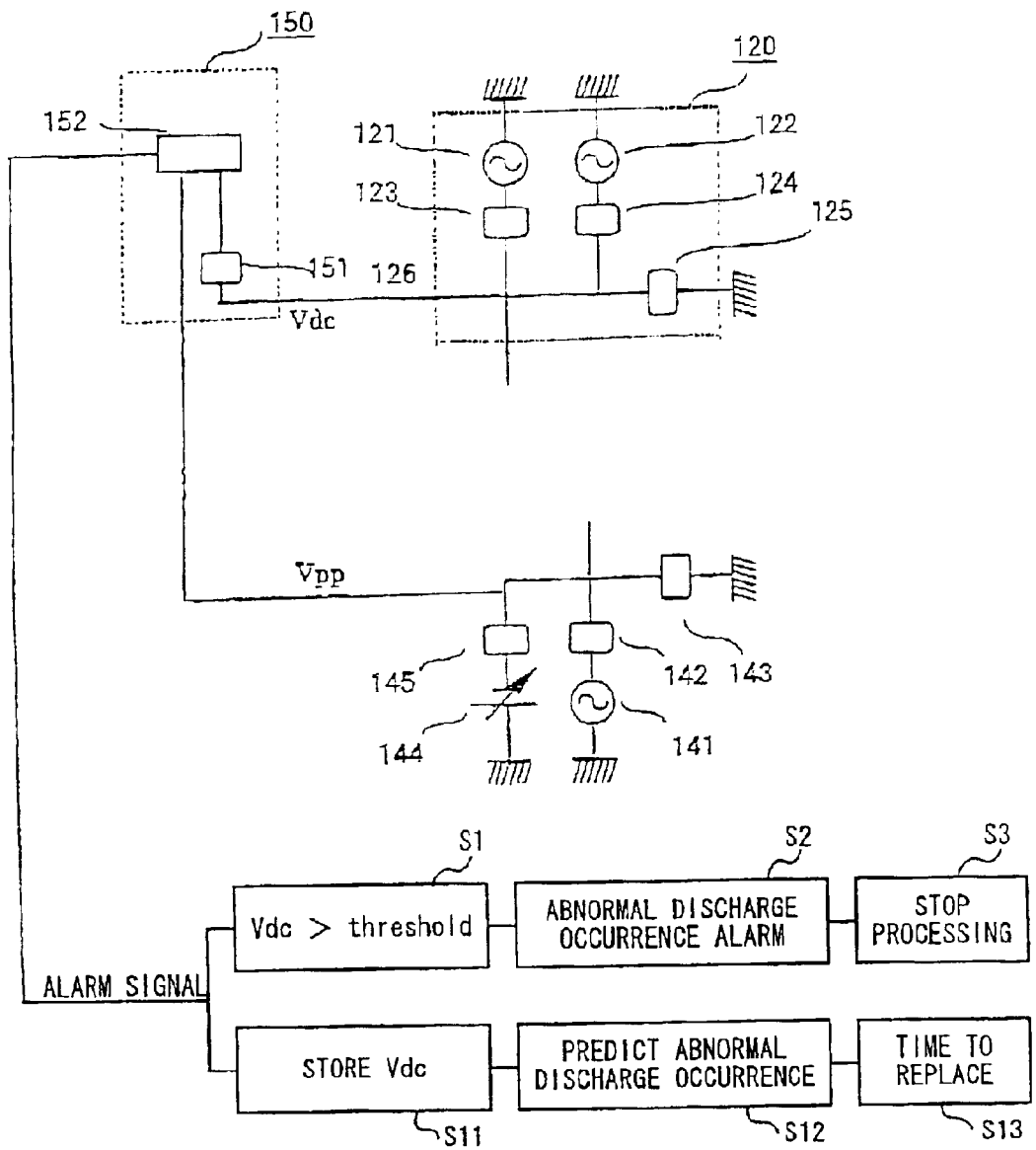
FIG. 2 shows abnormal discharge monitoring means.

FIG. 2 shows the abnormal discharge monitoring means for monitoring the abnormal discharge in the plasma processing apparatus. As shown, a signal line is drawn from an inner conductor of a feedthrough 126 that supplies power to the antenna 110. A signal measured on the signal line is composed of a signal of 450 MHz of the antenna power supply 121 and a signal of 13.56 MHz of the antenna bias power supply 122, which are superimposed on each other. The signal is passed through a bias potential extraction filter 151 to extract the bias potential Vdc, and the bias potential is transmitted to the abnormal discharge determination means 152. The abnormal discharge determination means 152 eliminates slight fluctuations (shown in FIG. 3) included in the received bias potential Vdc in order to extract a significant Vdc variation associated with the abnormal discharge. As described earlier, since the S/N ratio of the Vdc variation is sufficiently high, the filtering and the extraction of the variation can be sufficiently accomplished by usual methods.

Another signal line is drawn from the conductor that supplies power to the lower electrode 130. A signal measured on the signal line is of a frequency of 400 kHz to 13.56 MHz of the bias power supply 141 for the lower electrode. The signal is passed through a voltage amplitude extraction filter to extract the voltage amplitude Vpp, and the voltage amplitude is transmitted to the abnormal discharge determination means 152.

The abnormal discharge determination means 152 has functions described below. First, it has an abnormal discharge detection function to detect an abnormal discharge at an early state. Specifically, the detected variation of the bias potential Vdc is compared with a threshold previously provided (step S1), and if its is larger than the threshold, an "abnormal discharge occurrence" signal is output (step S2). This signal is transmitted to a control unit (not shown) in the processing apparatus, and the processing apparatus stops etching in response to the signal (step S3). Thus, only one poorly processed wafer is produced. To the contrary, if the abnormal discharge determination means 152 is not provided, the etching apparatus continues its processing, and the processing failure of wafers is not revealed until the wafers are inspected. Thus, a large number of poorly processed wafers are produced.

Second, it has an abnormal discharge occurrence prediction function to predict when an abnormal discharge will occur. As shown in FIG. 5, the occurrence of the abnormal discharge can be detected when the bias voltage Vdc having been substantially constant starts to vary. Therefore, values of the bias voltage Vdc are sequentially stored (step S11), prediction is made on when the abnormal discharge occurs based on the stored voltage values (step S12), and components such as the conductive plate can be replaced based on the prediction (step S13).

In the above description, the abnormal discharge determination means 152 detects or predicts the occurrence of the abnormal discharge based on the bias potential Vdc of the upper electrode. However, as shown in FIG. 5, the abnormal discharge occurs when the voltage amplitude Vpp having been substantially constant starts to vary. Therefore, the occurrence of the abnormal discharge can be detected or predicted based on the bias potential Vpp of the lower electrode, instead of the bias potential Vdc of the upper electrode.

Since there are two kinds of comparison objects, Vdc and Vpp, the two objects can independently be compared with their respective thresholds, and if at least one of them is larger than the threshold thereof, it can be determined that "the abnormal discharge has occurred". Alternatively, these two data can be used together to determine the occurrence of the abnormal discharge.

As shown in FIG. 6, when the value obtained by combining the bias potentials Vdc and Vpp having been substantially constant (product thereof in the drawing) starts to vary, the abnormal discharge occurs. Therefore, the occurrence of the abnormal discharge can be detected or predicted based on the product of the bias potential Vdc of the upper electrode and the voltage amplitude Vpp of the lower electrode, instead of the bias potential Vdc of the upper electrode. In this case, since the product of the bias potentials Vdc and Vpp is calculated, the detection sensitivity can be enhanced.

Figure 8:
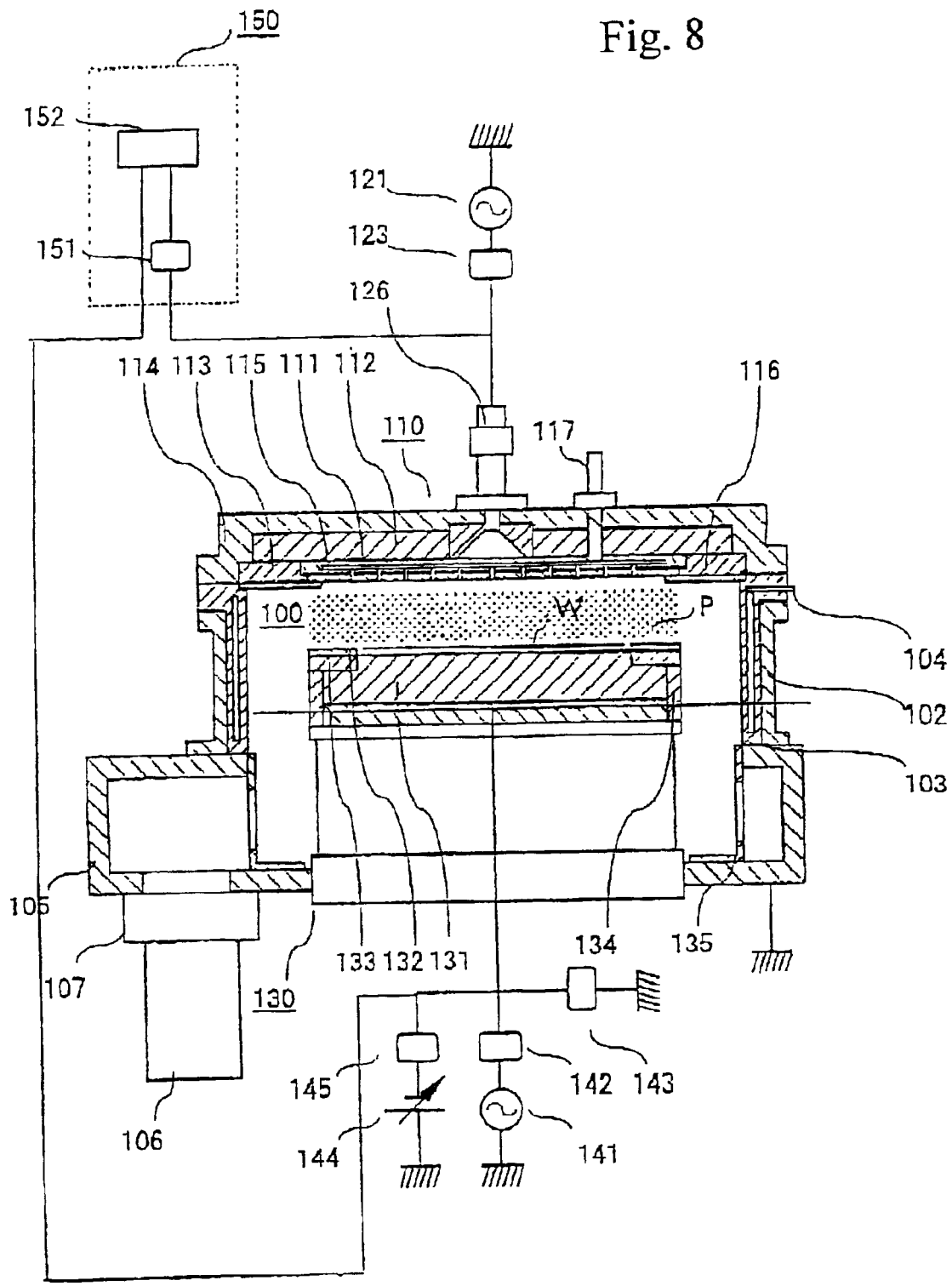
FIG. 8 shows a parallel plate plasma processing apparatus.

The present invention is not limited to the UHF-ECR (Electron Cyclotron Resonance) apparatus shown in FIG. 1, which is a plasma processing apparatus in which an electromagnetic wave of 450 MHz is used as the plasma source. This invention can also be applied to the parallel plate plasma processing apparatus shown in FIG. 8.

As described above, according to the present embodiment, the occurrence of the abnormal discharge is detected or predicted by monitoring the bias potential applied to the upper electrode (composed of a plate made of silicon, for example) disposed to face the wafer and the bias potential applied to the lower electrode on which the wafer is mounted, and extracting the variations thereof. Thus, the upper electrode can be used until the end of the product life thereof, and the cost of consumable components can be reduced. Furthermore, it becomes possible to prevent a large number of poorly processed wafers from being produced, and predict when the plate is to be replaced.

As described above, the present invention provides an apparatus for monitoring a plasma processing apparatus that can predict the occurrence of an abnormal discharge or detect the occurrence immediately.

What is claimed is:

1. An apparatus for monitoring a plasma processing apparatus, comprising:

a vacuum process chamber that contains an upper electrode having a conductive plate with gas supply holes for supplying a process gas and a lower electrode having a platform on which a sample is to be mounted;

process gas supply means for supplying the process gas to said gas supply holes in said upper electrode and exhaust means for exhausting said vacuum process chamber;

a high frequency power supply for applying a high frequency power to said upper electrode to generate a plasma between the upper and lower electrodes;

a high frequency bias power supply for applying a high frequency power to said upper electrode to generate a direct current bias potential in the upper electrode; and abnormal discharge determination means for determining whether an abnormal discharge has occured or not based on the direct current bias potential generated in said upper electrode.

2. An apparatus for monitoring a plasma processing apparatus, comprising:

a vacuum process chamber that contains an upper electrode having a conductive plate with gas supply holes for supplying a process gas and a lower electrode having a platform on which a sample is to be mounted;

process gas supply means for supplying the process gas to said gas supply holes in said upper electrode and exhaust means for exhausting said vacuum process chamber;

a high frequency power supply for applying a high frequency power to said upper electrode to generate a plasma between the upper and lower electrodes;

a high frequency bias power supply for applying a high frequency power to said upper electrode to generate a direct current bias potential in the upper electrode;

a bias power supply for lower electrode for applying a high frequency power to said lower electrode to generate a voltage amplitude in the lower electrode; and abnormal discharge determination means for determining whether an abnormal discharge has occurred or not based on the voltage amplitude generated in said upper electrode.

3. An apparatus for monitoring a plasma processing apparatus, comprising:

a vacuum process chamber that contains an upper electrode having a conductive plate with gas supply holes for supplying a process gas and a lower electrode having a platform on which a sample is to be mounted;

process gas supply means for supplying the process gas to said gas supply holes in said upper electrode and exhaust means for exhausting said vacuum process chamber;

a high frequency power supply for applying a high frequency power to said upper electrode to generate a plasma between the upper and lower electrodes;

a high frequency bias power supply for applying a high frequency power to said upper electrode to generate a direct current bias potential in the upper electrode;

a bias power supply for lower electrode for applying a high frequency power to said lower electrode to generate a voltage amplitude in the lower electrode; and abnormal discharge determination means for determining whether an abnormal discharge has occurred or not based on the direct current bias potential generated in said upper electrode and the voltage amplitude generated in said upper electrode.

4. An apparatus for monitoring a plasma processing apparatus, comprising:

a vacuum process chamber that contains an upper electrode having a conductive plate with gas supply holes for supplying a process gas and a lower electrode having a platform on which a sample is to be mounted;

process gas supply means for supplying the process gas to said gas supply holes in said upper electrode and exhaust means for exhausting said vacuum process chamber;

a high frequency power supply for applying a high frequency power to said upper electrode to generate a plasma between the upper and lower electrodes;

a high frequency bias power supply for applying a high frequency power to said upper electrode to generate a direct current bias potential in the upper electrode;

a bias power supply for lower electrode for applying a high frequency power to said lower electrode to generate a voltage amplitude in the lower electrode;

a database for storing the normal value of the direct current bias potential of the upper electrode obtained by monitoring the same according to various plasma processing conditions; and abnormal discharge determination means for determining whether an abnormal discharge has occurred or not based on the direct current bias potential generated in said upper electrode and the normal value of the direct current bias potential of the upper electrode stored in said database.

5. The apparatus for monitoring a plasma processing apparatus according to any one of claims 1 to 3, wherein said abnormal discharge determination means accumulates the history of variation of said direct current bias potential and predicts the occurrence of the abnormal discharge based on the result of the accumulated data.

* * * * *